(12) United States Patent
Lu et al.

(10) Patent No.: US 10,867,809 B2
(45) Date of Patent: Dec. 15, 2020

(54) LASER ANNEAL PROCESS

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Chun-Ti Lu, Kaohsiung (TW); Meng-Chin Lee, Tainan (TW); Fang-Liang Lu, New Taipei (TW); Chee-Wee Liu, Taipei (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 15/996,254

(22) Filed: Jun. 1, 2018

(65) Prior Publication Data

US 2019/0157104 A1 May 23, 2019

Related U.S. Application Data

(60) Provisional application No. 62/590,207, filed on Nov. 22, 2017.

(51) Int. Cl.
*H01L 21/324* (2006.01)
*H01L 21/268* (2006.01)
*H01L 29/78* (2006.01)
*H01L 29/165* (2006.01)
*H01L 21/67* (2006.01)
(Continued)

(52) U.S. Cl.
CPC ........ *H01L 21/3242* (2013.01); *B23K 26/352* (2015.10); *H01L 21/268* (2013.01); *H01L 21/67115* (2013.01); *H01L 29/1054* (2013.01);
*H01L 29/66545* (2013.01); *H01L 29/66553* (2013.01); *H01L 29/66803* (2013.01); *H01L 29/7848* (2013.01); *H01L 29/165* (2013.01); *H01L 29/66795* (2013.01)

(58) Field of Classification Search
CPC .......... H01L 21/268; H01L 21/823418; H01L 21/823431; H01L 29/0847; H01L 29/66795
See application file for complete search history.

(56) References Cited

U.S. PATENT DOCUMENTS

| | | | |
|---|---|---|---|
| 6,426,278 B1 * | 7/2002 | Nowak | H01L 21/223 438/528 |
| 6,919,239 B2 * | 7/2005 | Zhang | H01L 21/223 438/166 |

(Continued)

OTHER PUBLICATIONS

Weiner, Kurt H., Projection Gas Immersion Laser Doping (P-GILD): A Resistless, Nanosecond Thermal Doping/Diffusion Technology, 1994, Materials Science (Year: 1994).*

(Continued)

*Primary Examiner* — Robert G Bachner
*Assistant Examiner* — Molly K Reida
(74) *Attorney, Agent, or Firm* — Maschoff Brennan

(57) ABSTRACT

A method of forming a semiconductor device includes forming a doped region on a semiconductor substrate, in which the doped region comprises an impurity therein, and performing a laser anneal process to the doped region with a process gas containing a dopant gas, in which the dopant gas and the impurity comprise the same chemical element.

20 Claims, 11 Drawing Sheets

(51) Int. Cl.
*B23K 26/352* (2014.01)
*H01L 29/66* (2006.01)
*H01L 29/10* (2006.01)

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 2007/0116872 A1* | 5/2007 | Li .................... C23C 16/12 427/248.1 |

OTHER PUBLICATIONS

Vitali, G. et al., Effects of low-power pulsed-laser annealing on electrical properties of Zn-implanted InP, 1998, Solid State Communications, vol. 106, No. 7, pp. 421-423 (Year: 1998).*

* cited by examiner

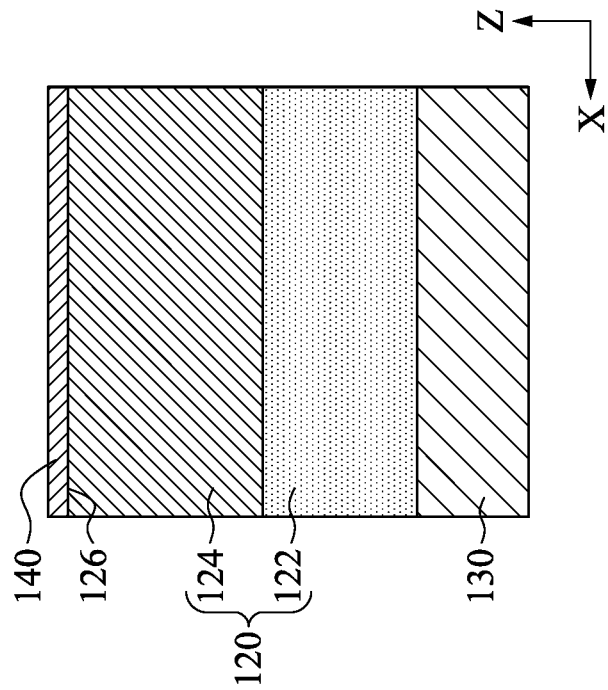
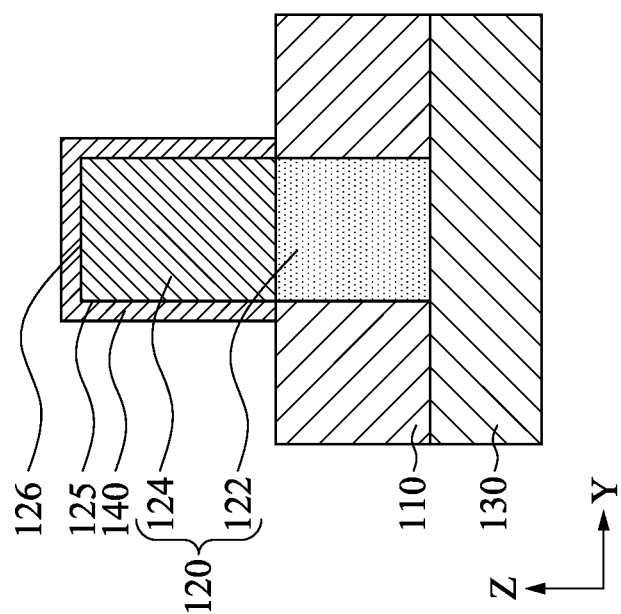
Fig. 5
Fig. 4

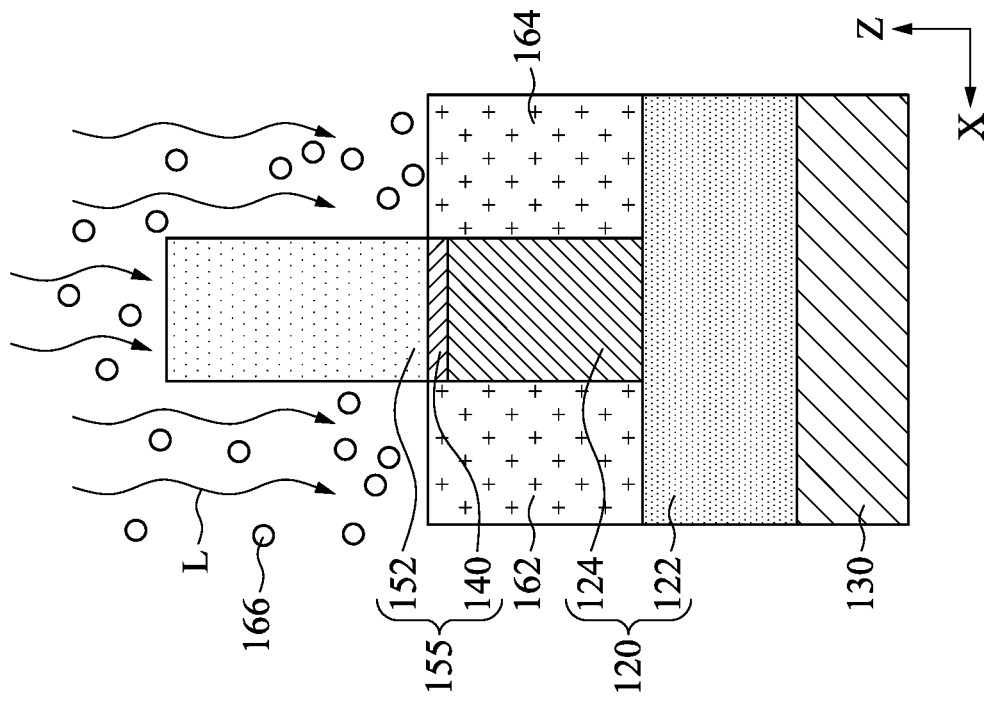
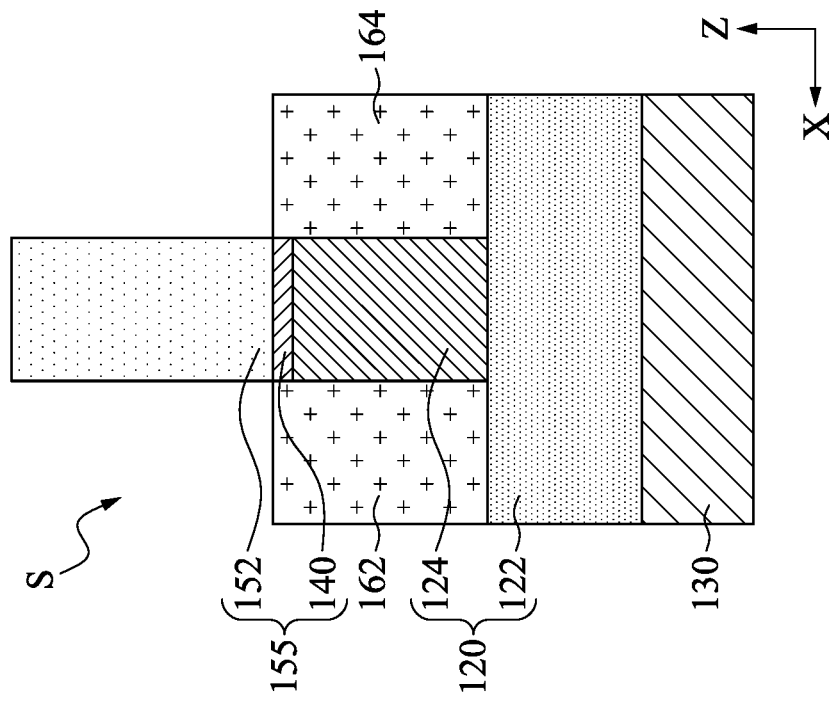

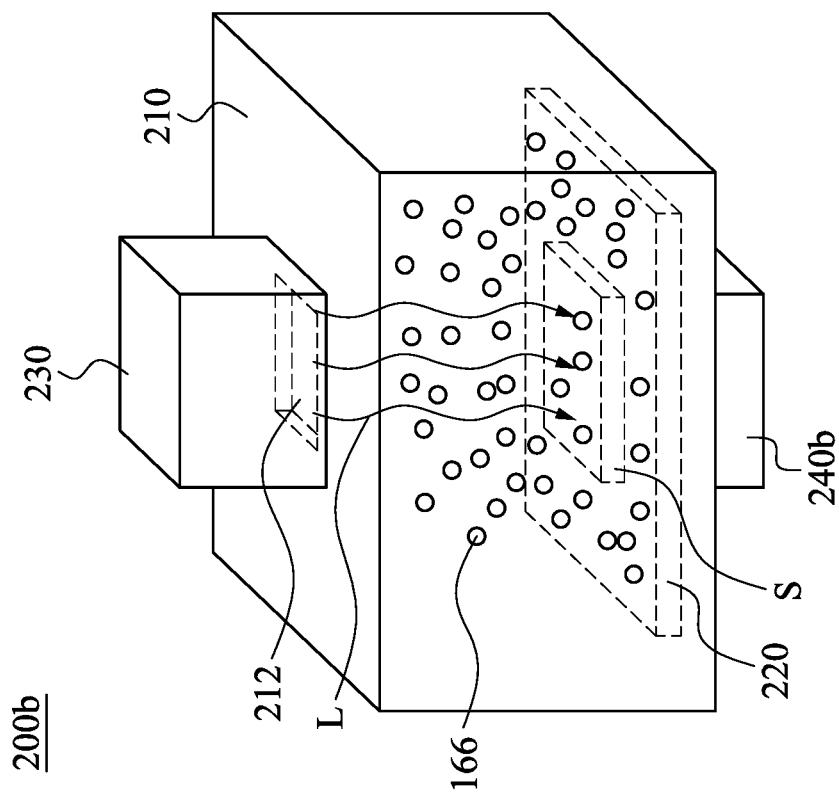
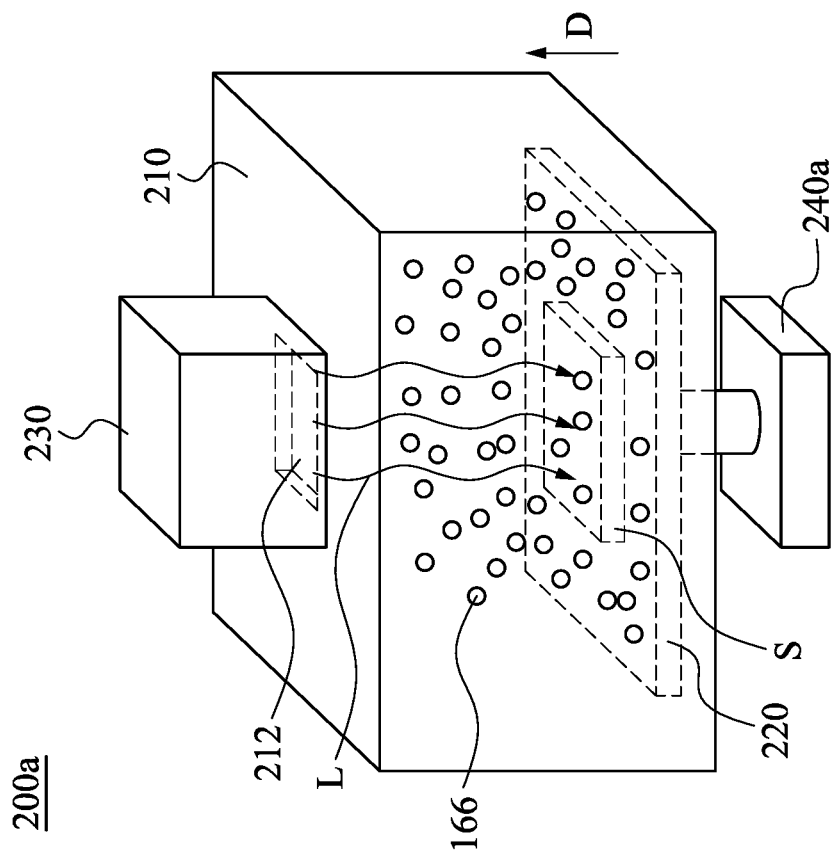

LASER ANNEAL PROCESS

PRIORITY CLAIM AND CROSS-REFERENCE

This application claims priority to U.S. Provisional Application Ser. No. 62/590,207, filed on Nov. 22, 2017, which is herein incorporated by reference in its entirety.

BACKGROUND

Semiconductor devices are small electronic components that are fabricated on a semiconductor wafer substrate. Using a variety of fabrication techniques, these devices are made and connected together to form integrated circuits. A number of integrated circuits may be found on one chip, and are capable of performing a set of useful functions in the operation of an electronic appliance. Examples of such electronic appliances are mobile telephones, personal computers, and personal gaming devices. As the size of these popular devices would imply, the components formed on a chip are small.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3-11 are cross-sectional views of intermediate stages in forming a semiconductor device in accordance with some embodiments of the present disclosure;

FIG. 13 is a perspective view of a semiconductor apparatus in accordance with some embodiments of the present disclosure;

FIG. 14 is a perspective view of a semiconductor apparatus in accordance with some embodiments of the present disclosure.

DETAILED DESCRIPTION

Figure 1:
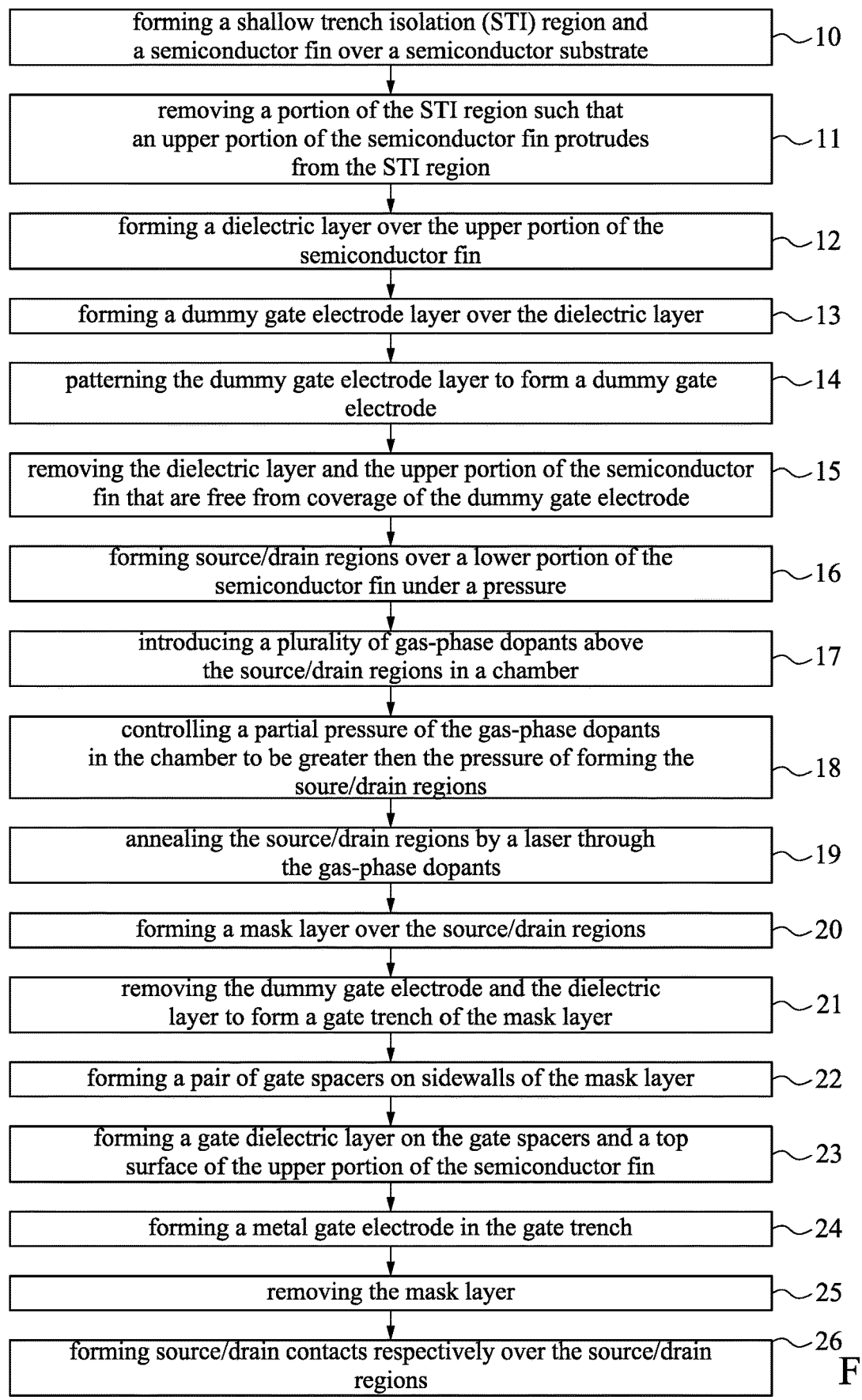
FIG. 1 is a flowchart of a method of forming a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Gate spacers are formed alongside the patterned sacrificial layer using a self-aligned process. The sacrificial layer is then removed, and the remaining gate spacers may then be used to pattern the fins.

Figure 3:
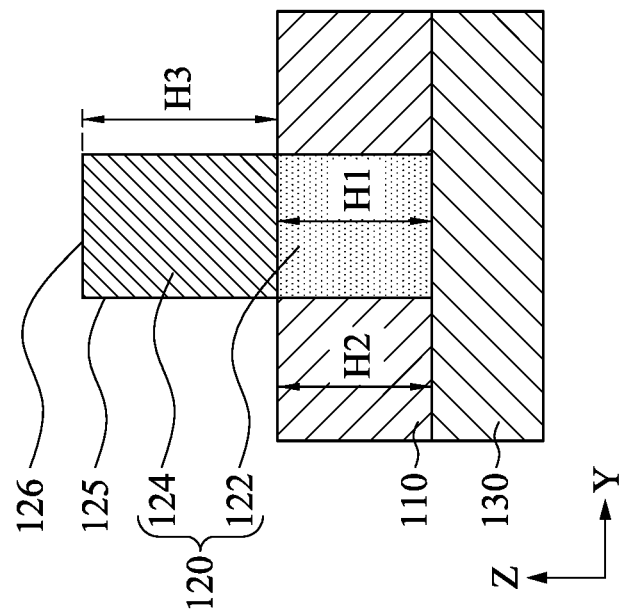
Figure 2:
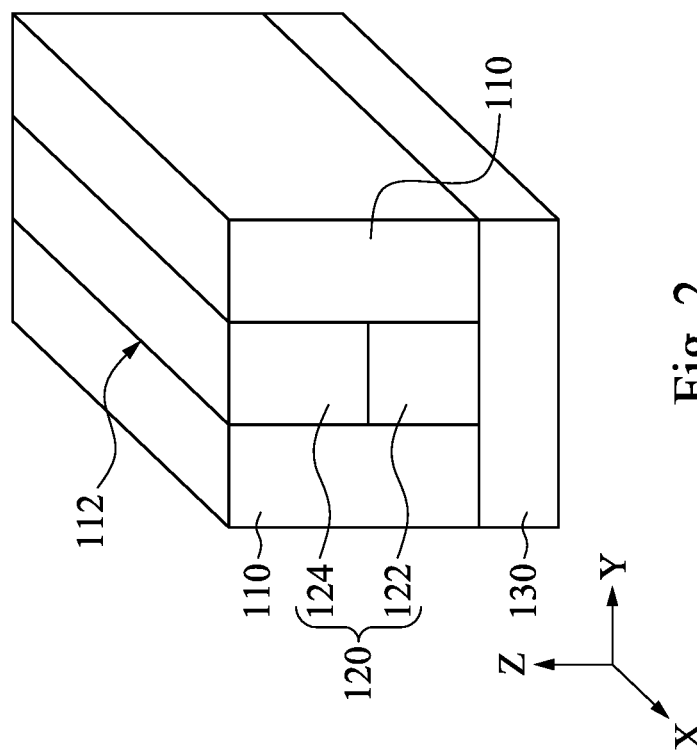
FIG. 2 is a perspective view of a semiconductor substrate with a shallow trench isolation region and a semiconductor fin in accordance with some embodiments of the present disclosure.
Figure 7:
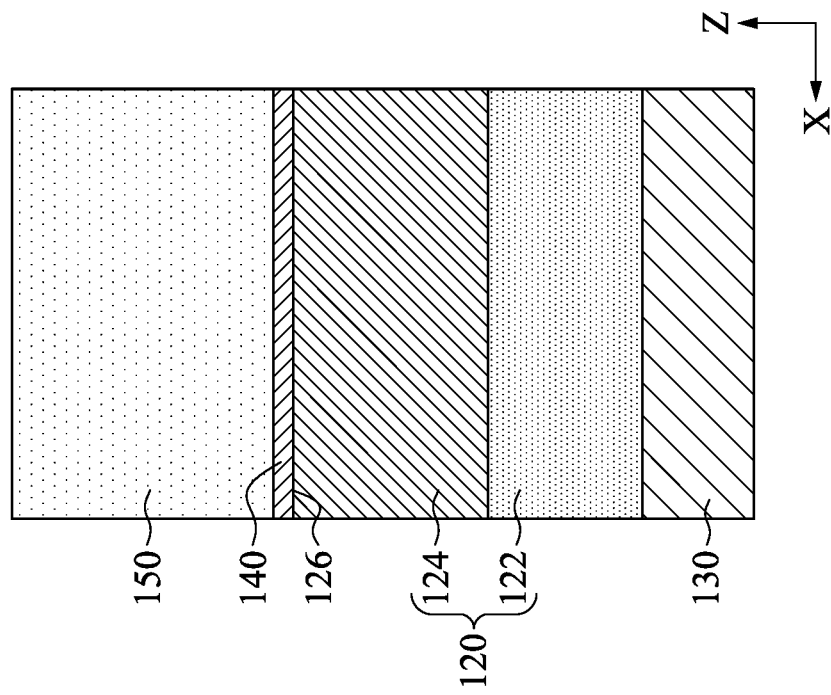
Figure 6:
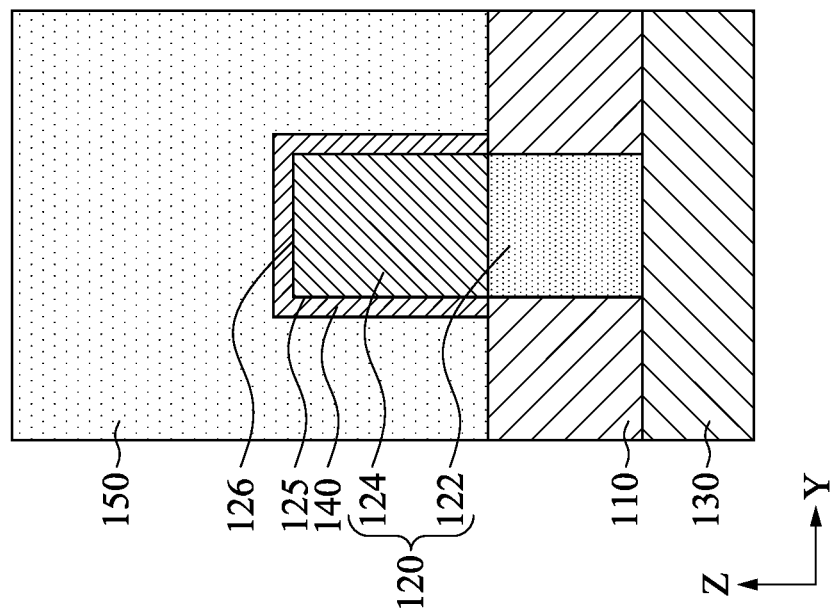
Figure 9:
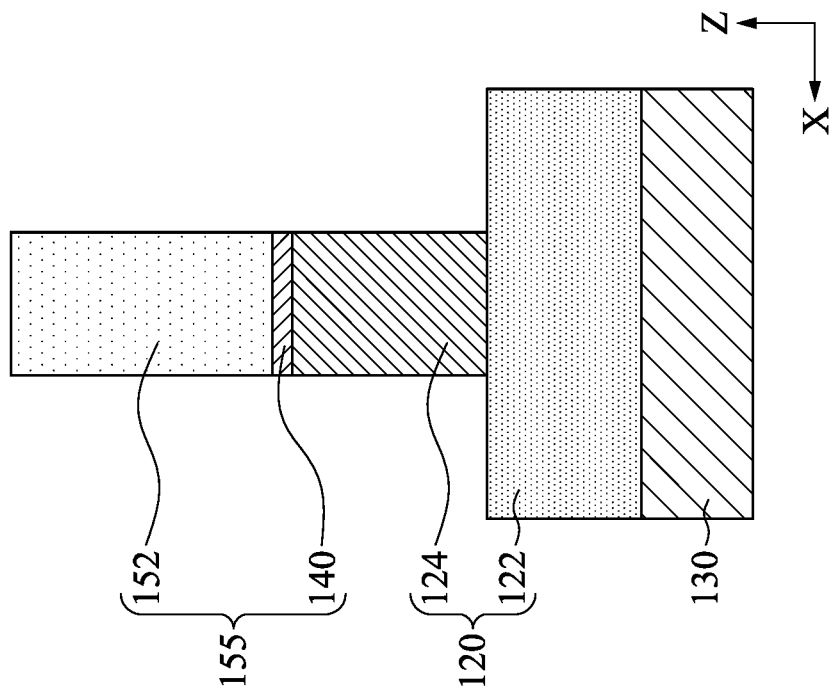
Figure 8:
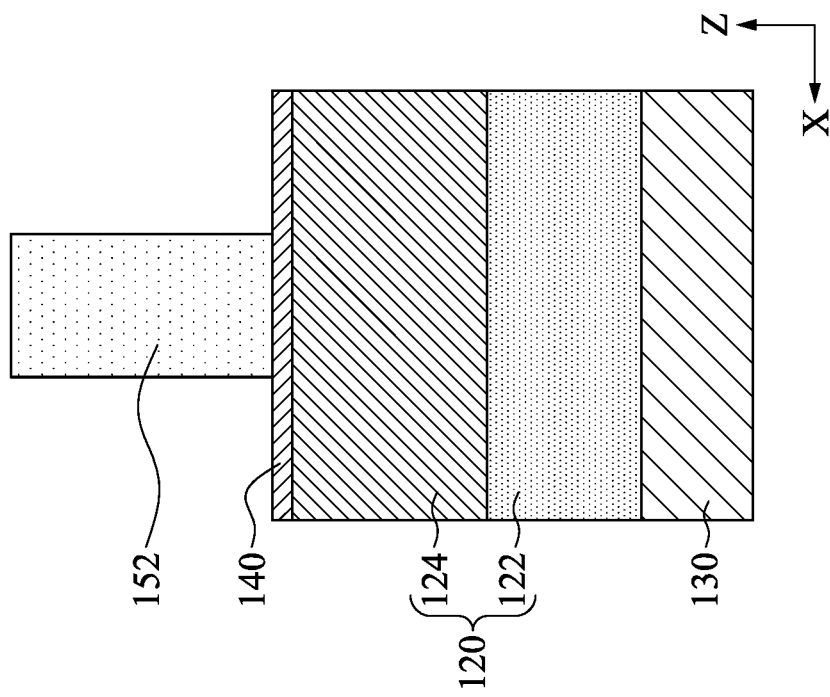

FIG. 1 is a flowchart of a method of forming a semiconductor device in accordance with some embodiments of the present disclosure. The method begins with block 10 in which a shallow trench isolation (STI) region 110 and a semiconductor fin 120 are formed over a semiconductor substrate 130 (as shown in FIG. 2). The method continues with block 11 in which a portion of the STI region 110 is removed such that an upper portion 124 of the semiconductor fin 120 protrudes from the STI region 110 (as shown in FIG. 3). The method continues with block 12 in which a dielectric layer 140 is formed over the upper portion 124 of the semiconductor fin 120 (as shown in FIGS. 4 and 5). The method continues with block 13 in which a dummy gate electrode layer 150 is formed over the dielectric layer 140 (as shown in FIGS. 6 and 7). The method continues with block 14 in which the dummy gate electrode layer 150 is patterned to form a dummy gate electrode 152 (as shown in FIG. 8). The method continues with block 15 in which the dielectric layer 140 and the upper portion 124 of the semiconductor fin 120 that are free from coverage of the dummy gate electrode 152 are removed (as shown in FIG. 9). The method continues with block 16 in which source/drain regions 162 and 164 are formed over a lower portion 122 of the semiconductor fin 120 under a pressure (as shown in FIG. 10). The method continues with block 17 in which a plurality of gas-phase dopants 166 are introduced above the source/drain regions 162 and 164 in a chamber (as shown in FIG. 11). The method continues with block 18 in which a partial pressure of the gas-phase dopants 166 in the chamber are controlled to be greater than the pressure of forming the source/drain regions 162 and 164 (as shown in FIG. 11). The method continues with block 19 in which the source/drain regions 162 and 164 are annealed by a laser through the gas-phase dopants 166 (as shown in FIG. 11). The method continues with block 20 in which a mask layer 170 is formed over the source/drain regions 162 and 164 (as shown in FIG.

Figure 16:
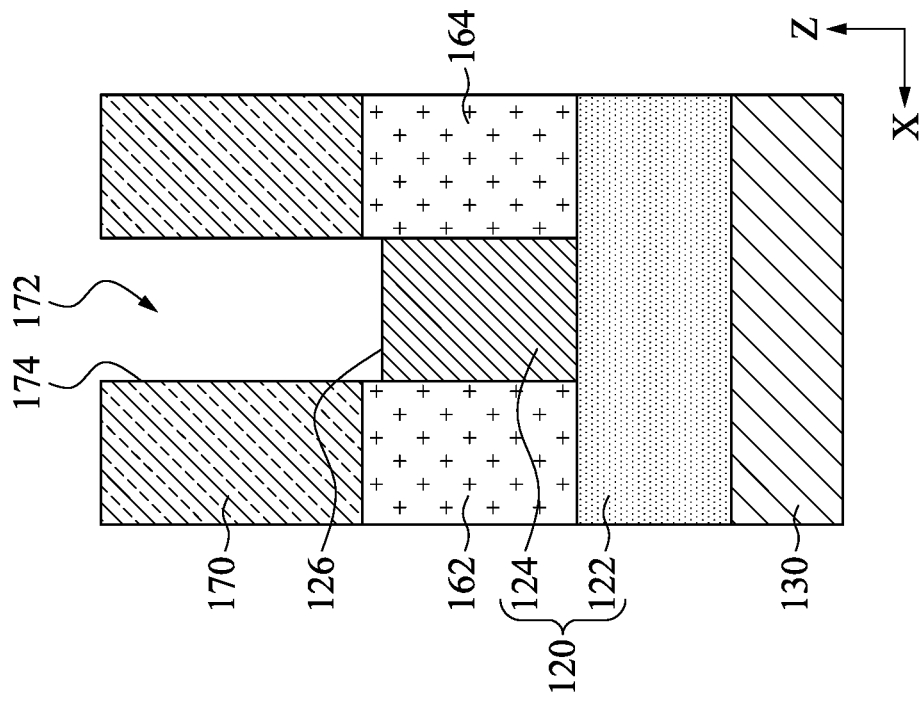
FIGS. 15-19 are cross-sectional views of intermediate stages during forming the semiconductor device after a step of FIG. 11.
Figure 18:
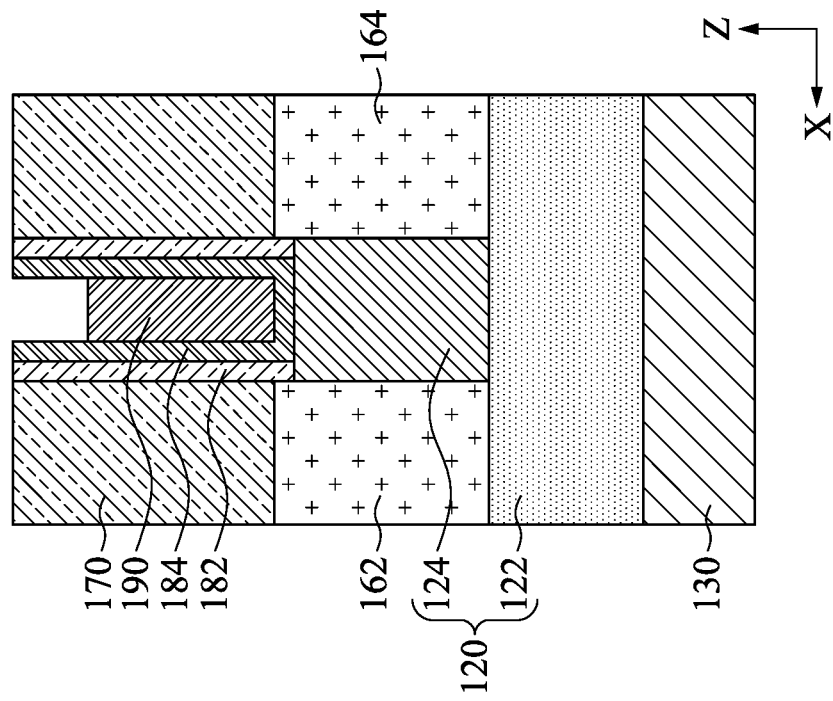
Figure 17:
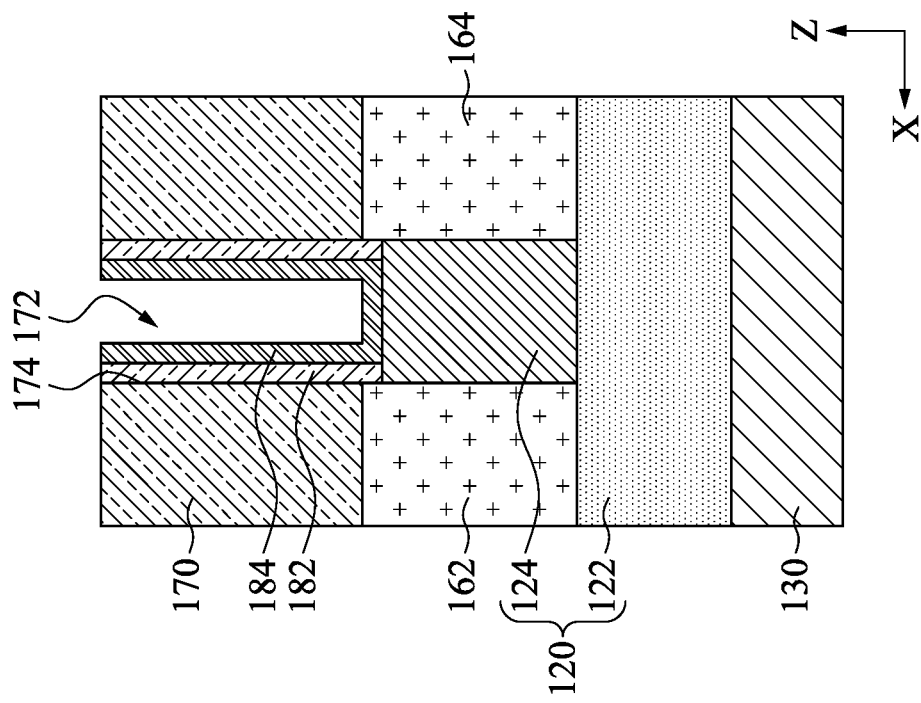
Figure 19:
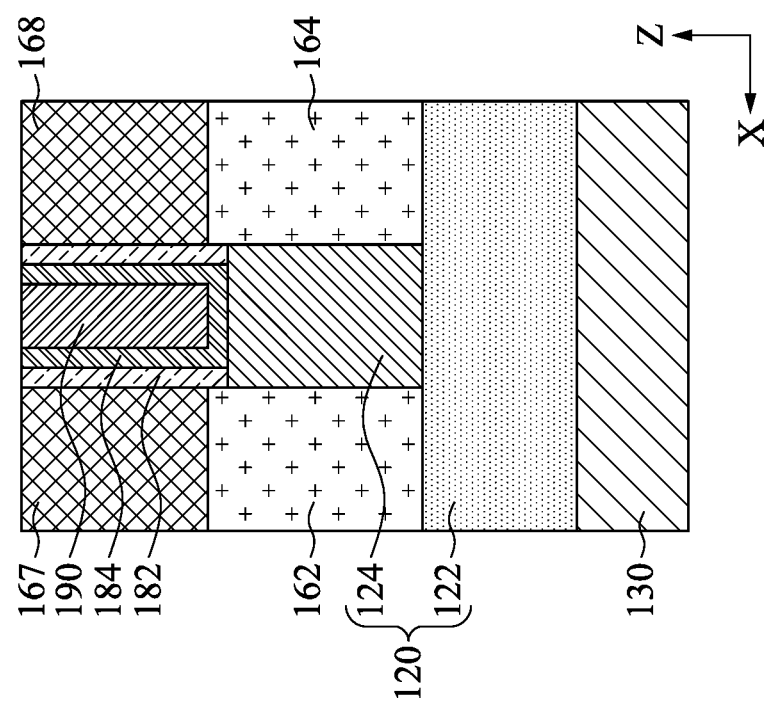

15). The method continues with block 21 in which the dummy gate electrode 152 and the dielectric layer 140 are removed to form a gate trench 172 of the mask layer 170 (as shown in FIG. 16). The method continues with block 22 in which a pair of gate spacers 182 is formed on sidewalls 174 of the mask layer 170 (as shown in FIG. 17). The method continues with block 23 in which a gate dielectric layer 184 is formed on the gate spacers 182 and a top surface 126 of the upper portion 124 of the semiconductor fin 120 (as shown in FIG. 18). The method continues with block 24 in which a metal gate electrode 190 is formed in the gate trench 172 (as shown in FIG. 18). The method continues with block 25 in which the mask layer 170 is removed (as shown in FIG. 19). The method continues with block 26 in which source/drain contacts 167 and 168 are respectively formed over the source/drain regions 162 and 164 (as shown in FIG. 19).

FIG. 2 is a perspective view of a semiconductor substrate 130 with a shallow trench isolation (STI) region 110 and a semiconductor fin 120 in accordance with some embodiments of the present disclosure. The STI region 110 and the semiconductor fin 120 are formed over the semiconductor substrate 130. The formation of the STI region 110 and the semiconductor fin 120 may include forming a dielectric material over the semiconductor substrate 130, forming a mask, such as a photoresist mask, over the semiconductor substrate 130 and the dielectric material, patterning the mask to expose at least a portion of the dielectric material, removing the exposed portion of the dielectric material to define the STI region 110 with a trench 112, removing the mask, and forming the semiconductor fin 120 in the trench 112 of the STI region 110 by epitaxial growth.

The semiconductor substrate 130 may be, for example, a bulk Si wafer, a bulk germanium (Ge) wafer, a semiconductor-on-insulator (SOI) substrate, or a strained semiconductor-on-insulator (SSOI) substrate. The semiconductor substrate 130 may include a semiconductor material, such as a group IV element, e.g., Ge or Si, a III-V compound, or a II-VI compound.

The STI region 110 may include a dielectric material, such as silicon nitride ($Si_3N_4$) or silicon dioxide ($SiO_2$). The STI region 110 may be formed by any suitable technique, e.g., thermal oxidation or PECVD. The trench 112 may be substantially rectangular in terms of cross-sectional profile, a top view, or both.

The semiconductor fin 120 may include a group IV element or compound, a III-V compound, or a II-VI compound. Examples of suitable group IV elements or compounds include Ge, Si, SiGe, and SiC. Examples of suitable III-V compounds include gallium arsenide (GaAs), gallium nitride (GaN), InAs, InSb, InAlSb, AlSb, indium aluminum arsenide (InAlAs), indium phosphide (InP), and InGaAs. Examples of suitable II-VI compounds include CdSe, ZnTe, and CdTe. The semiconductor fin 120 may be formed by selective epitaxial growth in any suitable epitaxial deposition system, including, but not limited to, metal-organic chemical vapor deposition (MOCVD), atmospheric-pressure CVD (APCVD), low-(or reduced-) pressure CVD (LPCVD), ultra-high-vacuum CVD (UHCVD), molecular beam epitaxy (MBE), or atomic layer deposition (ALD). In the CVD process, selective epitaxial growth typically includes introducing a source gas into the chamber. The source gas may include at least one precursor gas and a carrier gas, such as, for example, hydrogen. The reactor chamber may be heated by, for example, RF-heating. The growth system may also utilize low-energy plasma to enhance the layer growth kinetics. A planarization step such as, e.g., CMP may be used to ensure that the top surface of the semiconductor fin 120 is substantially co-planar with the top surface of the STI region 110.

In some embodiments, the semiconductor fin 120 includes a lower portion 122 and an upper portion 124. The lower portion 122 includes a first semiconductor material, and the upper portion 124 includes a second semiconductor material. The first semiconductor material may be different from the second semiconductor material. Each of the first and second semiconductor materials may selectively include one or more of a group IV element or compound, a III-V compound, or a II-VI compound. For example, the first semiconductor material includes relaxed SiGe, and the second semiconductor material includes Si. In alternative embodiments, the first semiconductor material includes relaxed SiGe, and the second semiconductor material includes Ge.

In some embodiments, the lower portion 122 of the semiconductor fin 120 is a strain relax buffer (SRB) layer. The SRB layer 122 may be substantially relaxed when the material of the SRB layer 122 is lattice mismatched to the material underlying the SRB layer 122, such as the material of the semiconductor substrate 130. The SRB layer 122 may be substantially relaxed through plastic relaxation by dislocations being generated in the SRB layer 122 and/or through elastic relaxation. The SRB layer 122 may further induce a strain in an overlying material, such as the upper portion 124 of the semiconductor fin 120. When a relaxed layer, such as the SRB layer 122, is lattice mismatched with an overlying layer, such as the upper portion 124, the overlying layer may be strained through pseudomorphic epitaxial growth. The type of strain in the overlying the upper portion 124 (e.g., compressive strain or tensile strain) may vary depending on whether n-type or p-type devices are desired, and the type of strain achieved may be adjusted by selecting a suitable atomic percentage of Ge in the SRB layer 122 and the upper portion 124.

FIGS. 3-11 are cross-sectional views of intermediate stages in forming a semiconductor device in accordance with some embodiments of the present disclosure. Referring to FIG. 3, after the STI region 110 and the semiconductor fin 120 are formed over the semiconductor substrate 130, the STI region 110 is thinned down to a level lower than a top of the semiconductor fin 120. For example, the STI region 110 is thinned down by an isotropic etch, e.g., a wet etch employing, for example, HF. As a result, the upper portion 124 of the semiconductor fin 120 protrudes from the STI region 110, and sidewalls 125 and a top surface 126 of the upper portion 124 of the semiconductor fin 120 are exposed. A dry etch may also be used, e.g., a plasma etch employing $CF_4$ and $H_2$. In some embodiments, a height H1 of the lower portion 122 of the semiconductor fin 120 is substantially the same as a height H2 of the remaining STI region 110. In addition, the height H1 of the lower portion 122 of the semiconductor fin 120 and a height H3 of the upper portion 124 of the semiconductor fin 120 may be selected so that the second lower portion 122 is relaxed and the upper portion 124 is strained, or vice versa.

Referring to FIG. 4, a dielectric layer 140 is formed over the upper portion 124 of the semiconductor fin 120, in which the sidewalls 125 and the top surface 126 of the upper portion 124 are covered by the dielectric layer 140 (also shown in FIG. 5). In other words, the dielectric layer 140 is formed along the sidewalls 125 and the top surface 126 of the upper portion 124. In some embodiments, the dielectric layer 140 may be, e.g., $SiO_2$, $Si_3N_4$, $HfO_2$, HfSiON, and/or HfSiO.

Referring to FIG. 6 and FIG. 7, a dummy gate electrode layer 150 is formed over the dielectric layer 140. The dielectric layer 140 is between the dummy gate electrode layer 150 and the upper portion 124 of the semiconductor fin 120. After the formation of the dummy gate electrode layer 150, the dummy gate electrode layer 150 and the underlying dielectric layer 140 are disposed along the upper portion 124 of the semiconductor fin 120. The dummy gate electrode layer 150 has three portions, two on each sidewall 125 of the upper portion 124 of the semiconductor fin 120 and one on the top surface 126 of the semiconductor fin 120. In some embodiments, the dummy gate electrode layer 150 may be made of material including polysilicon, amorphous Si, Ge, or SiGe gate material, or a metal or metal alloy.

Referring to FIG. 8, the dummy gate electrode layer 150 is then patterned to form a dummy gate electrode 152 by using a mask over a portion of the dummy gate electrode layer 150. As a result, a profile of the dummy gate electrode 152 is defined by the mask. The dummy gate electrode layer 150 may be patterned by an etching process, such as a dry plasma etching process or a wet etching process. At least one parameter, such as etchant, etching temperature, etching solution concentration, etching pressure, source power, radio frequency (RF) bias voltage, etchant flow rate, of the patterning (or etching) recipe can be tuned. After the patterning process, the mask over the dummy gate electrode 152 is then removed. In addition, since a portion of the dummy gate electrode layer 150 is removed, the dielectric layer 140 not covered by the remaining dummy gate electrode layer 150 (i.e., the dummy gate electrode 152) is exposed.

Referring to FIG. 9, portions of the dielectric layer 140 and the upper portion 124 of the semiconductor fin 120 free from coverage of the dummy gate electrode 152 are removed. The combination of the dielectric layer 140 and the dummy gate electrode 150 is referred to as a gate stack 155, and the gate stack 155 is over the remaining upper portion 124 of the semiconductor fin 120.

Referring to FIG. 10, source/drain regions 162 and 164 are formed over the lower portion 122 of the semiconductor fin 120. The source/drain regions 162 and 164 abut the upper portion 124 of the semiconductor fin 120 under the gate stack 155. As a result, the upper portion 124 of the semiconductor fin 120 is located between the source/drain regions 162 and 164.

The source/drain regions 162 and 164 may be formed under a pressure using one or more epitaxy or epitaxial (epi) processes, such that Si features (e.g., Si or $Si_{1-x}$), SiGe features, Ge features (e.g., $Ge_x$ or Ge), and/or other suitable features can be formed in a crystalline state on the lower portion 122 of the semiconductor fin 120. In some embodiments, the lattice constant of the source/drain regions 162 and 164 are different from the lattice constant of the semiconductor fin 120, and the source/drain regions 162 and 164 are strained or stressed to enable carrier mobility of the semiconductor device and enhance the device performance. The epitaxy processes include CVD deposition techniques (e.g., vapor-phase epitaxy (VPE), reduced pressure chemical vapor deposition (RPCVD) and/or ultra-high vacuum CVD (UHV-CVD)), molecular beam epitaxy, and/or other suitable processes. The epitaxy process may use gaseous and/or liquid precursors, which interact with the composition of the lower portion 122 of the semiconductor fin 120 (e.g., SiGe). Thus, a strained channel can be achieved to increase carrier mobility and enhance device performance. The source/drain regions 162 and 164 may be in-situ doped. The doping species include p-type dopants, such as boron or $BF_2$; n-type dopants, such as phosphorus or arsenic; and/or other suitable dopants including combinations thereof. In some embodiments, the source/drain regions 162 and 164 are doped by n-type dopants, such as $PH_3$. The partial pressure of $PH_3$ is in a range from about 1E-5 torr to about 1 torr. For example, the partial pressure of $PH_3$ is in a range from about 1E-4 torr to about 1E-2 torr if the source/drain region 162 and 164 are in-situ doped using reduced pressure chemical vapor deposition (RPCVD). In some embodiments, the total pressure of formation of the source/drain regions 162 and 164 may be in a range from about 1 torr to about 100 torr. If the source/drain regions 162 and 164 are not in-situ doped, an implantation process (i.e., a junction implant process) is performed to dope the source/drain regions 162 and 164. After doping the source/drain regions 162 and 164, the source/drain regions 162 and 164 have impurities (i.e., dopants) therein.

Referring to FIG. 11, a laser anneal process is performed to activate the source/drain regions 162 and 164. In order to increase the active dopant concentration of the source/drain regions 162 and 164, a method of annealing the source/drain regions 162 and 164 includes introducing a plurality of gas-phase dopants 166 (i.e., dopant gas) above the source/drain region 162 and 164 in a chamber that accommodates the structure of FIG. 10, controlling a partial pressure of the gas-phase dopants 166 in the chamber to be greater than the partial pressure of the p-type or n-type dopants during forming the source/drain regions 162 and 164, and annealing the source/drain regions 162 and 164 by a laser L through the gas-phase dopants 166. The total pressure of the laser anneal process may be in a range from about 1 torr to about 7600 torr, such as in a range from about 1 torr to about 100 torr. In some embodiments, the laser anneal process is performed to the doped source/drain regions 162 and 164 under a pressure greater than about 1 atm (i.e., 760 torr). In some embodiments, the gas-phase dopants 166 are n-type dopants, such as $PH_3$, and the partial pressure of $PH_3$ is in a range from about 1E-3 torr to about 760 torr during the laser anneal process, such as in a range from about 1E-1 torr to about 10 torr. Gas used in the laser anneal process can be a dopant precursor gas (e.g., $PH_3$) or a gas mixture including dopant precursor (e.g., $PH_3$ with $H_2$). Increase of the partial pressure of the gas-phase dopants 166 results in improved liquid solubility of the gas-phase dopants 166 according to Henry's law. Stated differently, the liquid solubility of the gas-phase dopants 166 increases as the partial pressure of the gas-phase dopants 166a increases. Moreover, because the active dopant concentration of the source/drain regions 162 and 164 is determined by the liquid solubility of the gas-phase dopants 166, the active dopant concentration of the source/drain regions 162 and 164 can be increased by increasing the liquid solubility of the gas-phase dopants 166. For example, the increase of active dopant concentration of the source/drain regions 162 and 164, resulting from the increased partial pressure of gas-phase dopants 166, is in a range from about 10% to about 100%, such as in a range from about 30% to about 60%.

In some embodiments, the SRB layer 122 includes Ge, and a wavelength of the laser L in the annealing process may be in a rage from about 193 nm to about 1878 nm, such as in a range from about 193 nm to about 532 nm. If the wavelength of the laser L is greater than about 1878 nm, Ge in the SRB layer 122 cannot absorb the laser L because the photon energy of the laser L is smaller than about 0.66 eV (the bandgap of Ge). In other words, when the wavelength is greater than about 1878 nm, the laser L cannot heat up Ge in the SRB layer 122. Moreover, a power density of the laser L in the annealing process may be in a rage from about 0.05

J/m² to about 3 J/m². If the power density of the laser L is lower than about 0.05 J/m², Ge in the SRB layer 122 will not be melted by the laser L. If the power density of the laser L is greater than about 3 J/m², Ge in the SRB layer 122 will be over melted, which is unacceptable because the melting of Ge will cause unintentional dopant diffusion. In addition, a full-width-at-half-maximum (FWHM) of the laser L in the annealing process may be in a rage from about 0.1 ns to about 1000 ns. If the FWHM of the laser L is shorter than about 0.1 ns, the FWHM of the laser L may be too fast to allow the melted atoms to rearrange themselves. If the FWHM is longer than about 1000 ns, liquid resulting from the laser L may move far from the designed region, which may frustrates fabrication of the source/drain regions. The laser L in the annealing process may be a line laser, an elliptic laser, a circle laser or other suitable lasers. In some embodiments, the gas-phase dopants 166 include P, $P_2$, $P_4$ or $PH_3$. In alternative embodiments, the gas-phase dopants 166 include As, $As_2$, $As_4$ or $AsH_3$. Other suitable dopants may be also used as the gas-phase dopants 166, and various embodiments of the present disclosure are not limited in this regard. Moreover, the dopant gas and the impurities of the source/drain regions 162 and 164 may include the same chemical element.

In the following description, various semiconductor apparatuses for annealing the source/drain regions 162 and 164 will be described.

Figure 12:
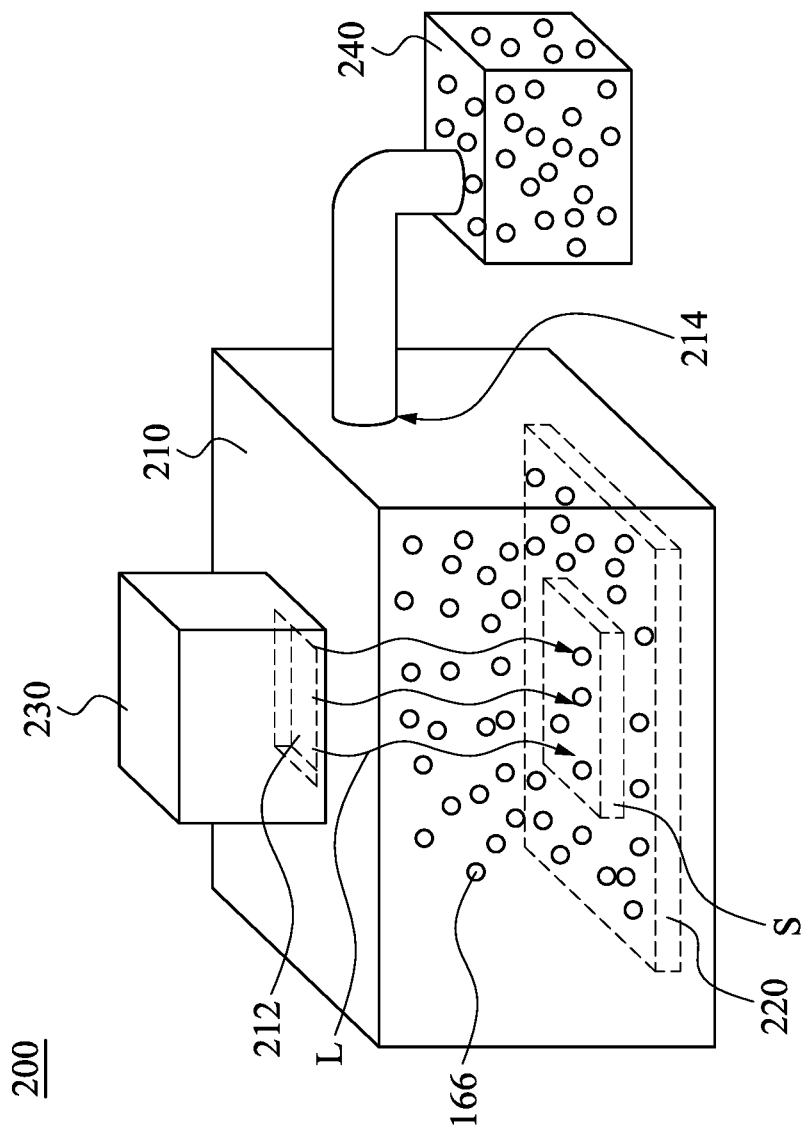
FIG. 12 is a perspective view of a semiconductor apparatus in accordance with some embodiments of the present disclosure.

FIG. 12 is a perspective view of a semiconductor apparatus 200 in accordance with some embodiments of the present disclosure. The semiconductor apparatus 200 includes a chamber 210, a stage 220, a laser source 230, and a pressure control tool 240. The chamber 210 has a light entrance 212, and accommodates the gas-phase dopants 166 and a semiconductor sample S with the source/drain regions 162 and 164 (e.g., the structure of FIG. 10). In some embodiments, the light entrance 212 is located on a top portion of the chamber 210. The stage 220 is disposed in the chamber 210 and under the light entrance 212. The stage 220 can support the semiconductor sample S with the source/drain regions 162 and 164. The laser source 230 is optically coupled to the light entrance 212 of the chamber 210. In some embodiments, the light entrance 212 of the chamber 210 may be an opening, a quartz window, or a fiber board to allow the laser L of the laser source 230 to transmit into the chamber 210. The pressure control tool 240 is connected to the chamber 210. The pressure control tool 240 is configured to pressurize the chamber 210, such that a pressure in the chamber 210 can be greater than the pressure of forming source/drain regions 162 and 164. Stated in another way, the chamber 210 is pressurized such that the partial pressure of the gas-phase dopants 166 in the chamber 210 can be greater than the partial pressure of the n-type or p-type dopants used in forming the source/drain regions 162 and 164.

In some embodiments, the chamber 210 has a dopant inlet 214, and the pressure control tool 240 is a sub-chamber. The dopant inlet 214 is located on a side portion of the chamber 210. The sub-chamber 240 is communicated with the chamber 210 through the dopant inlet 214 and accommodates the gas-phase dopants 166. A partial pressure of the gas-phase dopants 166 in the sub-chamber 240 is greater than the partial pressure of the gas-phase dopants 166 in the chamber 210. As a result of such a configuration, when the dopant inlet 214 is opened, the gas-phase dopants 166 can be introduced into the chamber 210 from the sub-chamber 240, thereby increasing the number of moles of the gas-phase dopants 166 in the chamber 210. The ideal gas equation is PV=nRT, in which P is pressure, V is volume, n is number of moles, R is the gas constant, and T is temperature. According to the ideal gas equation, due to the increased number of moles of the gas-phase dopants 166, the partial pressure of the gas-phase dopants 166 in the chamber 210 is increased. In other words, the partial pressure of the gas-phase dopants 166 in the chamber 210 is controlled by the number of moles of the gas-phase dopants 166 in the chamber 210. Therefore, the liquid solubility of the gas-phase dopants 166 and the active dopant concentration of the source/drain regions 162 and 164 are increased.

In some embodiments, a relative velocity between the stage 220 and the laser L during the annealing process may be in a range from 0.1 cm/s to 100 cm/s. A volume of the chamber 210 may be greater than about 324 cm²×0.1 cm to apply for 8-inch wafers (e.g., semiconductor samples S). Further, a volume of the chamber 210 may be greater than about 700 cm²×0.1 cm to apply for 12-inch wafers.

FIG. 13 is a perspective view of a semiconductor apparatus 200a in accordance with some embodiments of the present disclosure. The semiconductor apparatus 200a includes the chamber 210, the stage 220, the laser source 230, and a pressure control tool 240a. In some embodiments, the pressure control tool 240a includes a piston of a cylinder, but various embodiments of the present disclosure are not limited in this regard. The piston 240a abuts and is under the stage 220. The volume of the chamber 210 can be controlled by the level of stage 220. In such a design, when the piston 240a moves upwardly in a direction D to lift the stage 220, a volume of the chamber 210 is decreased. According to the ideal gas equation (i.e., PV=nRT), the decreased volume of the chamber 210 results in increasing the partial pressure of the gas-phase dopants 166 in the chamber 210. In other words, the partial pressure of the gas-phase dopants 166 in the chamber 210 is controlled by the volume of the chamber 210. Therefore, the liquid solubility of the gas-phase dopants 166 and the active dopant concentration of the source/drain regions 162 and 164 are increased.

FIG. 14 is a perspective view of a semiconductor apparatus 200b in accordance with some embodiments of the present disclosure. The semiconductor apparatus 200b includes the chamber 210, the stage 220, the laser source 230, and a pressure control tool 240b. In some embodiments, the pressure control tool 240b includes a heat source on or in the chamber 210. For example, the heat source 240b may be disposed on a bottom portion of the chamber 210, or may be disposed in the chamber 210, but various embodiments of the present disclosure are not limited in this regard. The temperature of the chamber 210 is controlled by the heat source 240b. In such a configuration, when the heat source 240b heats the chamber 210, a temperature of the chamber 210 is increased. According to the ideal gas equation (i.e., PV=nRT), the increased temperature of the chamber 210 results in increasing the partial pressure of the gas-phase dopants 166 in the chamber 210. In other words, the partial pressure of the gas-phase dopants 166 in the chamber 210 is controlled by the temperature of the chamber 210. Therefore, the liquid solubility of the gas-phase dopants 166 and the active dopant concentration of the source/drain regions 162 and 164 are increased.

In some embodiments, a temperature of the gas-phase dopants 166 substantially equal to that of the chamber 210 is in a range from about −100° C. to about 937° C., such as in a range from about 5° C. to about 50° C.

Moreover, the semiconductor apparatuses 200, 200a, and 200b of FIGS. 12-14 are examples, and various embodiments of the present disclosure are not limited in this regard. For example, a semiconductor apparatus may include any two of the sub-chamber 240, the piston 240a, and the heat source 240b, or may include all of the sub-chamber 240, the piston 240a, and the heat source 240b.

Figure 15:
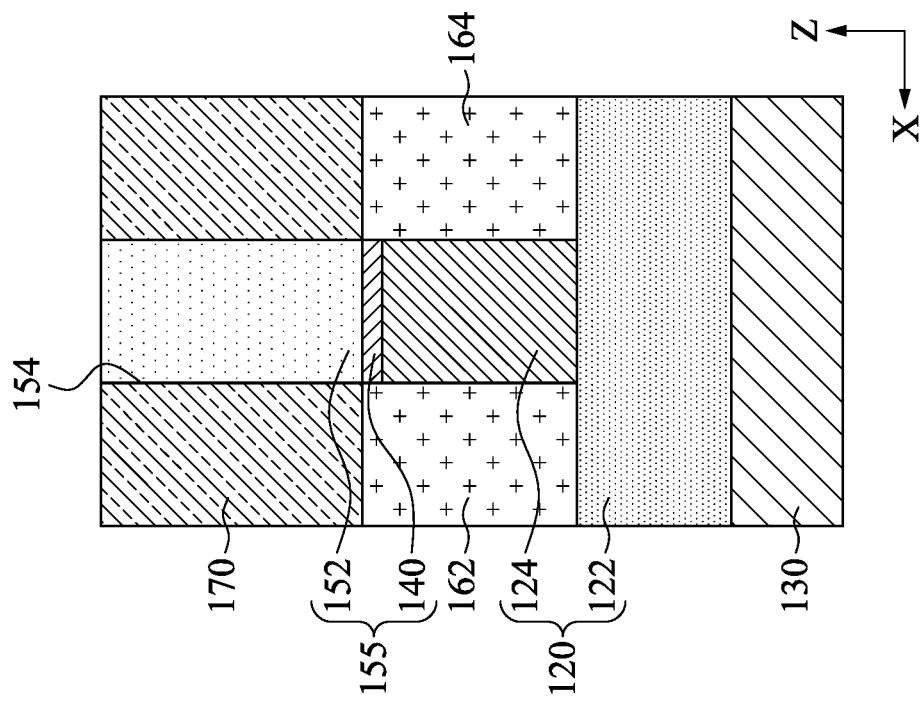

FIGS. 15-19 are cross-sectional views of intermediate stages during forming the semiconductor device after the step of FIG. 11. Referring to FIG. 15, after the laser anneal process is performed to the source/drain regions 162 and 164, a mask layer 170 is formed over the source/drain region 162 and 164. The mask layer 170 abuts sidewalls 154 of the dummy gate electrode 152. The mask layer 170 includes silicon oxide, oxynitride or other suitable materials. The mask layer 170 is formed by a suitable technique, such as CVD or ALD. A chemical mechanical planarization (CMP) process may be performed to remove excessive mask layer 170 and expose a top surface of the dummy gate electrode 152 to a subsequent dummy gate removing process.

Referring to FIG. 16, the gate stack 155 including the dummy gate electrode 152 and the dielectric layer 140 (see FIG. 15) is removed to form an gate trench 172 in the mask layer 170. Sidewalls 174 of the mask layer 170 and the top surface 126 of the upper portion 124 of the semiconductor fin 120 define the gate trench 172. In some other embodiments, the dummy gate electrode 152 is removed while the dielectric layer 140 remains. The dummy gate electrode 152 and the dielectric layer 140 may be removed by dry etch, wet etch, or a combination of dry and wet etch. For example, a wet etch process may include exposure to a hydroxide containing solution (e.g., ammonium hydroxide), deionized water, and/or other suitable etchant solutions.

Referring to FIG. 17, a pair of gate spacers 182 is formed along the sidewalls 174 of the mask layer 170 and on the upper portion 124 of the semiconductor fin 120. In some embodiments, the gate spacers 182 may include silicon oxide, silicon nitride, silicon oxy-nitride, or other suitable material. To form the gate spacers 182, a blanket layer may be formed on the upper portion 124 of the semiconductor fin 120 by CVD, PVD, ALD, or other suitable technique. Then, an anisotropic etching is performed on the blanket layer to remove horizontal portions of the blanket layer, and remaining portions of the blanket layer along the sidewalls 174 of the mask layer 170 can serve as the gate spacers 182.

Thereafter, a gate dielectric layer 184 is formed along sidewalls of the gate spacers 182 and the top surface 126 of the upper portion 124 of the semiconductor fin 120. Therefore, the gate spacers 182 are located between the gate dielectric layer 184 and the mask layer 170. The gate dielectric layer 184 may be formed by chemical vapor deposition or the like. The gate dielectric layer 184 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof.

Referring to FIG. 18, after the formations of the gate spacers 182 and the gate dielectric layer 184, a metal gate electrode 190 is formed in the gate trench 172. The gate electrode 190 is formed by the deposition of aluminum or other conductive metal such as copper, tungsten, or titanium. In some embodiments, depositing the gate trench 172 includes depositing a work function layer prior to depositing a metal fill layer. In addition, a CMP process may be applied to planarize the mask layer 170, the gate spacers 182, and the gate dielectric layer 184.

Referring to FIG. 19, the mask layer 170 (see FIG. 18) is removed from the source/drain regions 162 and 164, and source/drain contacts 167 and 168 are then respectively formed over the source/drain region 162 and 164. Metal such as tungsten can be deposited over the source/drain regions 162 and 164 to form the source/drain contacts 167 and 168. The source/drain contacts 167 and 168 are electrically connected to the source/drain regions 162 and 164.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that liquid solubility of gas-phase dopants is increased at an elevated pressure during laser-annealing the source/drain region, which in turn will increase dopant concentration in the source/drain region.

According to some embodiments, a method of forming a semiconductor device includes forming a doped region on a semiconductor substrate, in which the doped region comprises an impurity therein, and performing a laser anneal process to the doped region with a process gas containing a dopant gas, in which the dopant gas and the impurity comprise the same chemical element.

In some embodiments, the laser anneal process is performed under a process pressure greater than about 1 atm.

In some embodiments, the method further includes introducing the dopant gas into a chamber where the semiconductor substrate is, such that a partial pressure of the dopant gas in the chamber increases.

In some embodiments, the method further includes reducing a volume of a chamber where the semiconductor substrate is, such that a partial pressure of the dopant gas in the chamber increases.

In some embodiments, the method further includes raising a temperature in a chamber where the semiconductor substrate is, such that a partial pressure of the dopant gas in the chamber increases.

In some embodiments, a partial pressure of the dopant gas during the laser anneal process is in a range from about 1E-1 torr to about 10 torr.

In some embodiments, the dopant gas comprises n-type dopants.

In some embodiments, the doped region includes Si, Ge, or combinations thereof.

According to some embodiments, a method of forming a semiconductor device includes forming a doped source/drain region on a semiconductor substrate and performing a laser anneal process to the doped source/drain region under a process pressure greater than about 1 atm.

In some embodiments, the method further includes introducing a dopant gas into a chamber where the laser anneal process is performed prior to, during, or both prior to and during the laser anneal process.

In some embodiments, the doped region has an impurity therein, and the dopant gas and the impurity include the same chemical element.

In some embodiments, a partial pressure of the dopant gas during the laser anneal process is in a range from about 1E-1 torr to about 10 torr.

In some embodiments, a partial pressure of a dopant during forming the doped source/drain region is less than the partial pressure of the dopant gas during the laser anneal process.

In some embodiments, the method further includes reducing a volume of a chamber where the laser anneal process is performed prior to, during, or both prior to and during the laser anneal process.

In some embodiments, the method further includes raising a temperature in a chamber where the laser anneal process is performed prior to, during, or both prior to and during the laser anneal process.

According to some embodiments, a semiconductor apparatus includes a chamber, a wafer stage, a laser source, and a pressure control tool. The chamber has an inner spacer. The wafer stage is in the inner space of the chamber. The laser source is optically coupled to the inner space of the chamber. The pressure control tool is configured to pressurize the chamber.

In some embodiments, the chamber has a dopant inlet, and the pressure control tool includes a sub-chamber in communication with the chamber through the dopant inlet, and the sub-chamber is configured to introduce a dopant gas into the chamber.

In some embodiments, the pressure control tool includes a piston configured to push against the wafer stage.

In some embodiments, the pressure control tool includes a heat source thermally coupled to the chamber.

In some embodiments, the chamber has a light entrance between the laser source and the inner space of the chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a doped region on a semiconductor substrate with a first process gas having a dopant gas, wherein the doped region comprises an impurity therein; and
   performing a laser anneal process to the doped region with a second process gas having the dopant gas, wherein the dopant gas and the impurity comprise the same chemical element, and a partial pressure of the dopant gas during forming the doped region is less than a partial pressure of the dopant gas during the laser anneal process.

2. The method of claim 1, wherein the laser anneal process is performed under a process pressure greater than about 1 atm.

3. The method of claim 1, further comprising:
   introducing the dopant gas into a chamber where the semiconductor substrate is, such that the partial pressure of the dopant gas in the chamber increases.

4. The method of claim 1, further comprising:
   reducing a volume of a chamber where the semiconductor substrate is, such that the partial pressure of the dopant gas in the chamber increases.

5. The method of claim 1, further comprising:
   raising a temperature in a chamber where the semiconductor substrate is, such that the partial pressure of the dopant gas in the chamber increases.

6. The method of claim 1, wherein the partial pressure of the dopant gas during the laser anneal process is in a range from about 1E-1 torr to about 10 torr.

7. The method of claim 1, wherein the dopant gas comprises n-type dopants.

8. The method of claim 1, wherein the doped region comprises Si, Ge, or combinations thereof.

9. A method comprising:
   introducing a dopant gas into a chamber;
   forming a doped source/drain region on a semiconductor substrate; and
   performing a laser anneal process on the doped source/drain region under a process pressure greater than about 1 atm, wherein the laser anneal process is performed in the chamber, and a partial pressure of the dopant gas during the laser anneal process is in a range from about 1E-1 torr to about 10 torr.

10. The method of claim 9, wherein the doped source/drain region has an impurity therein, and the dopant gas and the impurity comprise the same chemical element.

11. The method of claim 9, wherein a partial pressure of a dopant during forming the doped source/drain region is less than the partial pressure of the dopant gas during the laser anneal process.

12. The method of claim 9, further comprising:
   reducing a volume of the chamber where the laser anneal process is performed prior to, during, or both prior to and during the laser anneal process.

13. The method of claim 9, further comprising:
   raising a temperature in the chamber where the laser anneal process is performed prior to, during, or both prior to and during the laser anneal process.

14. A method comprising:
   forming source/drain regions on a substrate in a chamber;
   introducing a dopant gas above the source/drain region in the chamber, wherein the dopant gas comprises gas-phase dopants therein;
   stopping the introducing of the dopant gas, then increasing a partial pressure of the gas-phase dopants in the chamber; and
   annealing the source/drain regions by a laser through the gas-phase dopants.

15. The method of claim 14, wherein increasing the partial pressure of the gas-phase dopants comprises:
   increasing a number of moles of the gas-phase dopants in the chamber.

16. The method of claim 14, wherein increasing the partial pressure of the gas-phase dopants comprises:
   decreasing a volume of the chamber.

17. The method of claim 16, wherein decreasing the volume of the chamber comprises:
   lifting a stage in the chamber, wherein the substrate is on the stage.

18. The method of claim 14, wherein increasing the partial pressure of the gas-phase dopants comprises:
   increasing a temperature of the chamber.

19. The method of claim 14, wherein increasing the partial pressure of the gas-phase dopants in the chamber is performed prior to annealing the source/drain regions.

20. The method of claim 14, wherein annealing the source/drain regions by the laser is performed under the increased partial pressure of the gas-phase dopants.

* * * * *